(12) United States Patent
Makino et al.

(10) Patent No.: US 9,000,297 B2
(45) Date of Patent: Apr. 7, 2015

(54) ELECTRIC JUNCTION BOX

(75) Inventors: Masahiro Makino, Kosai (JP);
Kazuyoshi Fujishiro, Kosai (JP);
Shouta Yamaguchi, Kosai (JP); Koki Sato, Kakegawa (JP); Takeshi Onoda, Kakegawa (JP)

(73) Assignee: Yazaki Corporation, Tokyo (JP)

( * ) Notice: Subject to any disclaimer, the term of this patent is extended or adjusted under 35 U.S.C. 154(b) by 198 days.

(21) Appl. No.: 13/248,772

(22) Filed: Sep. 29, 2011

(65) Prior Publication Data
US 2012/0073852 A1   Mar. 29, 2012

(30) Foreign Application Priority Data

Sep. 29, 2010  (JP) ................................ 2010-218436

(51) Int. Cl.
*H01J 5/00*     (2006.01)
*H01J 15/00*    (2006.01)
*H05K 5/00*     (2006.01)
*H02G 3/08*     (2006.01)
*H05K 5/02*     (2006.01)

(52) U.S. Cl.
CPC .................................. *H05K 5/0208* (2013.01)

(58) Field of Classification Search
None
See application file for complete search history.

(56) References Cited

U.S. PATENT DOCUMENTS

| | | | | |
|---|---|---|---|---|
| 4,946,137 A * | 8/1990 | Adamczek | ........... | 254/134.3 FT |
| 5,755,579 A * | 5/1998 | Yanase et al. | ................ | 439/76.2 |
| 5,857,874 A * | 1/1999 | Takeuchi | ................. | 439/620.26 |
| 5,975,933 A * | 11/1999 | Yamaguchi et al. | .......... | 439/247 |
| 6,140,582 A * | 10/2000 | Sheehan | ........................ | 174/669 |
| 6,201,922 B1 * | 3/2001 | Milanowski et al. | ......... | 385/135 |
| 6,276,960 B1 * | 8/2001 | Schaefer et al. | ............... | 439/522 |
| 6,541,700 B2 * | 4/2003 | Chiriku et al. | ................... | 174/50 |
| 6,610,926 B2 * | 8/2003 | Chiriku et al. | ................... | 174/60 |
| 6,743,981 B2 * | 6/2004 | Miyakoshi | ..................... | 174/668 |
| 6,848,916 B2 * | 2/2005 | Nakayama et al. | .......... | 439/76.2 |
| 7,046,115 B2 * | 5/2006 | Higuchi et al. | ................ | 337/193 |
| 7,182,626 B2 * | 2/2007 | Langolf | ......................... | 439/473 |
| 7,211,744 B2 * | 5/2007 | Jorgensen | ..................... | 174/668 |
| 7,232,342 B2 * | 6/2007 | Kubota | ..................... | 439/620.33 |

(Continued)

FOREIGN PATENT DOCUMENTS

| | | |
|---|---|---|
| CN | 1144336 C | 3/2004 |
| JP | 4-93423 U | 8/1992 |

(Continued)

OTHER PUBLICATIONS

English Translation and Japanese Office Action in corresponding JP Patent Application No. 2010-218436.

*Primary Examiner* — Hoa C Nguyen
*Assistant Examiner* — Xanthia C Cunningham
(74) *Attorney, Agent, or Firm* — Locke Lord LLP (57) ABSTRACT

An electric junction box 1 includes: a case 4; a tubular guide portion 5 projected from the case 4, and guiding a harness 6 out of the case 4. The guide portion 5 is divided to a pair of gutter-shaped portions 51, 52. Each of the gutter-shaped portions 51, 52 is composed of a bottom wall 53, 54 and a pair of vertical walls 55, 56 extended from both sides of the bottom wall 53, 54 in a circumferential direction Y2. An elastically deformable hinge 57 is provided between the gutter-shaped portion 52 and the case 4 and configured to allow the gutter-shaped portion 52 to be moved away from or close to the gutter-shaped portion 51. The vertical walls 55, 56 of the pair of gutter-shaped portions 51, 52 are overlapped with each other in a radial direction.

15 Claims, 7 Drawing Sheets

(56) References Cited

U.S. PATENT DOCUMENTS

| | | | |
|---|---|---|---|
| 7,264,511 B2* | 9/2007 | Asao | 439/620.27 |
| 7,357,541 B2* | 4/2008 | Gamache et al. | 362/448 |
| 7,544,888 B2* | 6/2009 | Ooi et al. | 174/50 |
| 7,563,109 B2* | 7/2009 | Kanamaru et al. | 439/76.2 |
| 7,566,829 B2* | 7/2009 | Nakayama et al. | 174/50 |
| 7,576,290 B1* | 8/2009 | Korcz | 174/655 |
| 7,586,038 B2* | 9/2009 | Kanamaru et al. | 174/50 |
| 7,893,364 B2* | 2/2011 | Oda | 174/520 |
| 8,163,994 B2* | 4/2012 | Taniguchi et al. | 174/50 |
| 2003/0000726 A1* | 1/2003 | Miyakoshi | 174/65 R |
| 2008/0053699 A1* | 3/2008 | Nakayama et al. | 174/532 |
| 2008/0149387 A1* | 6/2008 | Oda | 174/520 |
| 2008/0179469 A1* | 7/2008 | Leone et al. | 248/56 |
| 2009/0071679 A1* | 3/2009 | Yamamoto et al. | 174/50 |
| 2009/0135616 A1* | 5/2009 | Caluori | 362/404 |
| 2009/0139741 A1* | 6/2009 | Shimizu | 174/51 |
| 2009/0205865 A1* | 8/2009 | Korcz | 174/660 |
| 2009/0280661 A1* | 11/2009 | Akahori | 439/76.2 |
| 2009/0301774 A1* | 12/2009 | Byrne | 174/483 |
| 2010/0000757 A1* | 1/2010 | Husain et al. | 174/58 |

FOREIGN PATENT DOCUMENTS

| | | |
|---|---|---|
| JP | 2001-057720 A | 2/2001 |
| JP | 2006-149165 A | 6/2006 |
| JP | 2006-345616 A | 12/2006 |
| JP | 2007-014054 A | 1/2007 |
| JP | 2007-282320 A | 10/2007 |

* cited by examiner

ELECTRIC JUNCTION BOX

CROSS REFERENCE TO RELATED APPLICATIONS

This application is on the basis of Japanese Patent Application No. 2010-218436, the contents of which are hereby incorporated by reference.

BACKGROUND OF THE INVENTION

1. Field of the Invention

The present invention relates to an electric junction box attached to an inside of an engine room of a vehicle.

2. Description of the Related Art

Various electronic devices are mounted on a vehicle as a moving object. For supplying electric power to these various electronic devices, an electric junction box composed of intensive electric parts such as connector, relay, and fuse is disposed on a proper position between a battery and the electronic devices in the vehicle.

Incidentally, the electric junction box is also referred to as a junction block, a fuse block, or a relay box. In this description, the junction block, the fuse block, and the relay box are collectively called as the electric junction box.

Figure 10:
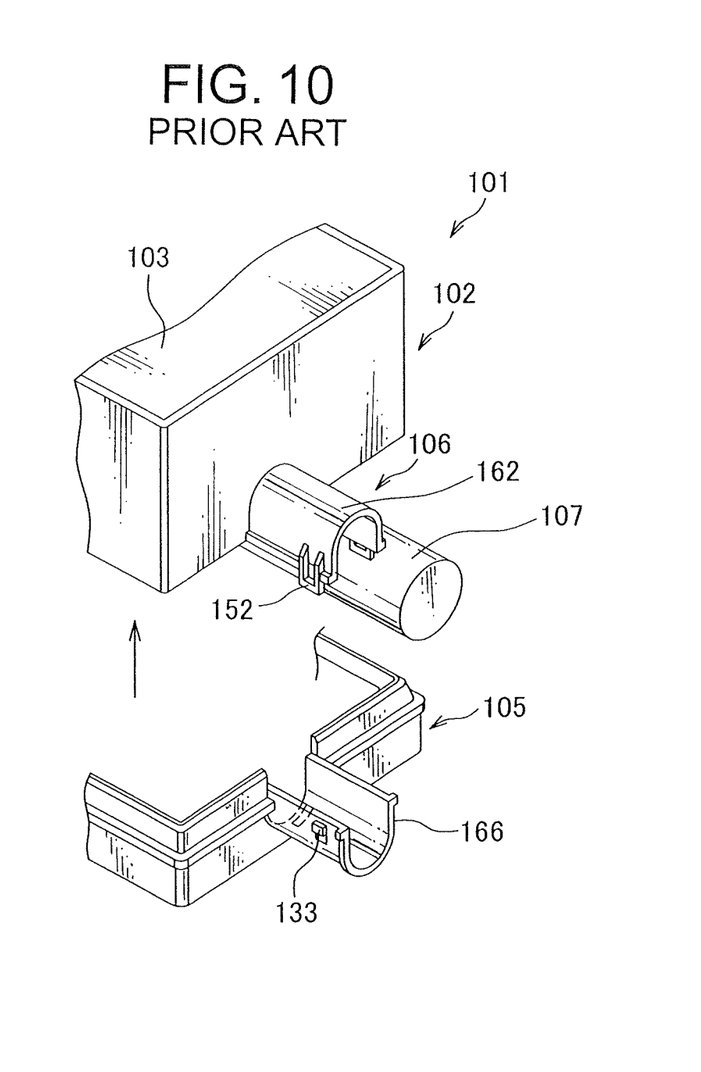
FIG. 10 is an exploded perspective view showing a part of a conventional electric junction box.

As a conventional electric junction box, a junction box shown in FIG. 10 is proposed (for example, Patent Documents 1 to 3). As shown in FIG. 10, an electric junction box 101 includes: a box main body 102 formed in a box shape, and receiving various electric parts (not shown) therein; and a harness 107 of which one end is connected to these electric parts, and the other end is passed through an inside of a later-described tubular guide portion 106 and guided out of the box main body 102.

The box main body 102 includes: a main body portion 103; a lower cover 105 detachably attached to the main body portion 103; and the guide portion 106 provided on an outer wall of the box main body 102 and of which inside the harness 107 is passed through and guided out from the box main body 102.

The guide portion 106 is projected from the outer wall of the box main body 102, and formed in a tubular shape of which inside the harness 107 is passed through. The guide portion 106 includes: a first member 162 formed in a semi-cylinder shape and projected from the main body portion 103; a second member 166 formed in a semi-cylinder shape and projected from the lower cover 105; a locking portion 152 provided on the first member 162 and locked with a lock receiving portion 133 of the second member 166; and the lock receiving portion 133. The guide portion 106 is dividably composed of the first member 162 and the second member 166.

The harness 107 is made by bundling a plurality of electric wires connecting various electric parts received in the box main body 102 with various electronic devices mounted on a vehicle.

In the electric junction box 101, the harness 107 is clipped between the first member 162 and the second member 166 of the guide portion 106, and the locking portion 152 is locked with the lock receiving portion 133. Thus, the guide portion 106 is assembled, and the lower cover 105 is attached to the main body portion 103.

The locking portion 152 and the lock receiving portion 133 are provided on the guide portion 106 of the conventional electric junction box 101, and an inner diameter of the guide portion 106 is fixed. Therefore, a harness 107 having an outer diameter larger than an inner diameter of the guide portion 106 cannot be passed through the guide portion 106.

Further, an outer diameter of the harness 107, namely, the number of bundled electric wires is varied corresponding to the electronic devices mounted on a vehicle which is varied according to a grade or a specification of the vehicle. Accordingly, the inner diameter of the guide portion 106 is tailored to the largest outer diameter of the harness 107 among the various outer diameters of the harness 107 according to the grade or the specification of the vehicle.

However, in the conventional electric junction box 101 described above, there is a problem described below. When the harness 107 having the largest outer diameter is passed through the guide portion 106, there is no gap between the guide portion 106 and the harness 107. When a slim harness 107 is passed, there is a gap between the guide portion 106 and the harness 107, and there is a fear that water may enter an inside of the box main body 102 via the gap.

Therefore, for example, an electric junction box able to fill the gap between a guide hole and the harness 107 regardless of the thickness of the harness 107 by providing a bellows-shaped extendable piece on an inner edge of the guide hole provided on a side wall of the box main body 102 is proposed (Patent Document 4). However, because this electric junction box needs the bellow-shaped extendable piece, there is a problem about cost.

[Patent Document 1] JP, A, H04-93423
[Patent Document 2] JP, A, 2007-14054
[Patent Document 3] JP, A, 2007.282320
[Patent Document 4] JP, A, 2006-345616

Accordingly, an object of the present invention is to provide at low cost an electric junction box able to prevent water from entering an inside of the electric junction box via a guide portion of a harness even when the harness having a different thickness is used.

SUMMARY OF THE INVENTION

In order to attain the object, according to the present invention, there is provided an electric junction box including:

a box main body;

a tubular guide portion projecting from the box main body and guiding a harness out of the box main body, said guide portion being divided to a pair of gutter-shaped portions, each gutter-shaped portion being composed of a bottom wall portion and a pair of vertical wall portions extended vertically from both sides of the bottom wall portion in a circumferential direction, and the respective vertical wall portions of the pair of gutter-shaped portions being overlapped with each other in a radial direction; and an elastically deformable flexible portion provided between at least one of the pair of gutter-shaped portions and the box main body, configured to allow the one gutter-shaped portion to be moved away from or close to the other gutter-shaped portion.

Preferably, the pair of gutter-shaped portions is so formed that the respective vertical wall portions of the pair of gutter-shaped portions are kept overlapped with each other from a position where the pair of gutter-shaped portions is moved closest to each other when the harness having the smallest outer diameter is passed through the guide portion to a position where the pair of gutter-shaped portions is moved farthest away from each other when the harness having the largest outer diameter is passed through the guide portion.

Preferably, a groove is provided on each vertical wall portion of the one gutter-shaped portion, and each vertical portion of the other gutter-shaped portion is inserted into the groove.

Preferably, the harness is passed through the guide portion while the flexible portion is bent from a neutral position of the flexible portion so as to position the pair of gutter-shaped portions away from each other.

Preferably, an inner diameter of the guide portion in the neutral state in which the flexible portion is not elastically deformed is fitted for the smallest outer diameter of the harness, and when the outer diameter of the harness is increased, the flexible portion is bent so as to move the pair of gutter-shaped portions away from each other.

These and other objects, features, and advantages of the present invention will become more apparent upon reading of the following detailed description along with the accompanied drawings.

BRIEF DESCRIPTION OF THE DRAWINGS

FIG. 7 is a partially perspective view showing the electric junction box shown in FIG. 6 when the harness having the minimum diameter Rmin is passed through;

FIG. 8 is a partially perspective view showing the electric junction box shown in FIG. 6 when the harness having the maximum diameter Rmax is passed through;

FIG. 9 is a partially perspective view showing the electric junction box shown in FIG. 6 when the harness having a diameter between the minimum diameter Rmin and the maximum diameter Rmax is passed through.

DETAILED DESCRIPTION OF THE PREFERRED EMBODIMENTS

First Embodiment

Hereinafter, an electric junction box 1 according to an embodiment of the present invention will be explained with reference to FIGS. 1 to 5. Incidentally, in FIGS. 4A and 5A, a harness is omitted.

Figure 1:
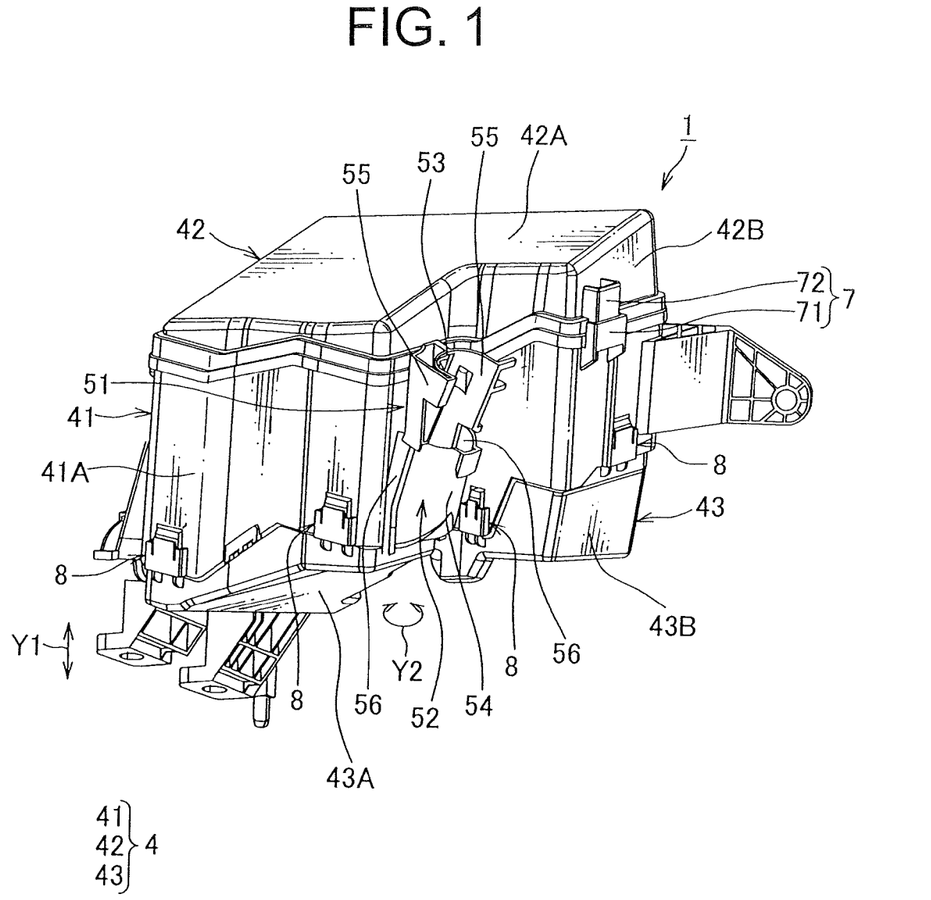
FIG. 1 is a perspective view showing an electric junction box according to a first embodiment of the present invention.

The electric junction box 1 shown in such as FIG. 1 is attached to an engine room of a vehicle for supplying electric power to various electronic parts mounted on the vehicle. Incidentally, in this description, junction block, fuse block, and relay box are collectively called as the electric junction box 1.

Figure 2:
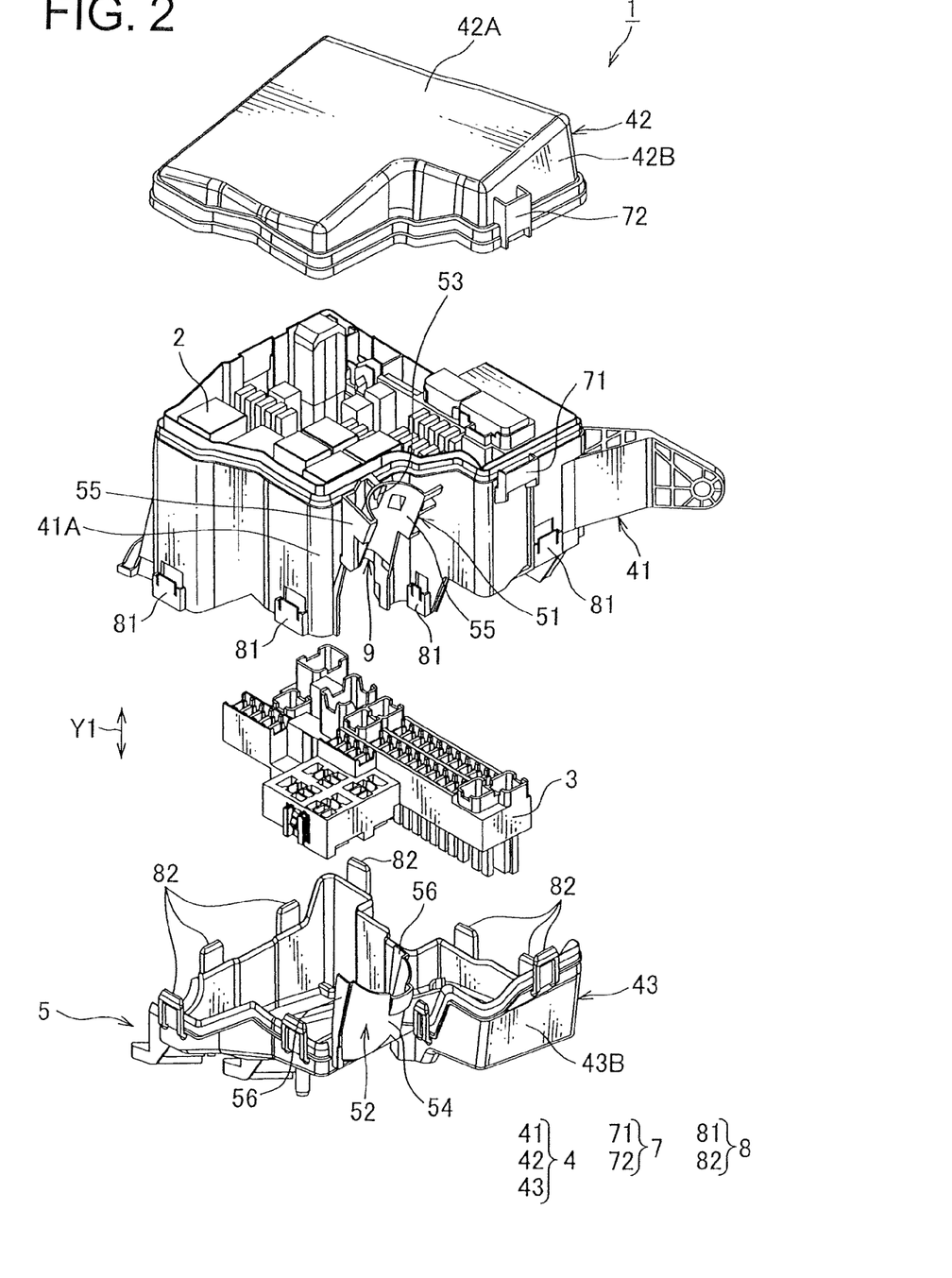
FIG. 2 is an exploded perspective view showing the electric junction box shown in FIG. 1.

As shown in FIG. 2, the electric junction box 1 includes: a plurality of electric parts 2; a cassette block 3 for holding the electric parts 2; a case 4 as a box main body of the electric junction box 1 for receiving the cassette block 3; and a tubular guide portion 5 projected from the case 4 for guiding a harness 6 (FIGS. 4 and 5) out of the case 4.

The cassette block 3 is made of insulating synthetic resin, and formed by well-known injection molding. The electric parts 2 such as not-shown fuse, fusible link, relay, bus bar are mounted on the cassette block 3.

As shown in FIGS. 1 and 2, the case 4 includes: a case main body 41 for receiving the cassette block 3; an upper cover 42 detachably provided up on the case main body 41; and a lower cover 43 detachably provided down on the case main body 41. Further, these case main body 41, upper cover 42, and lower cover 43 are made of insulating synthetic resin, and formed by well-known injection molding. Further, a vertical direction of the case 4 in this description indicates an arrow Y1 direction in FIGS. 1 and 2.

As shown in FIGS. 1 and 2, the case main body 41 is formed in a tubular shape having openings at both sides in the vertical direction Y1 by a plurality of peripheral walls 41A extended in the vertical direction Y1 and continued to each other. The cassette block 3 is received in the case main body 41.

The upper cover 42 is formed in a box shape having an opening downward in the vertical direction Y1 by a ceiling wall 42A covering an opening composed of an upper edge of the peripheral wall 41A of the case main body 41 in the vertical direction Y1, and by a peripheral wall 42B vertically extended downward in the vertical direction Y1 from an outer edge of the ceiling wall 42A. The upper cover 42 is attached to a top of the case main body 41 for covering an opening composed of an upper edge in the vertical direction Y1 of the peripheral wall 41A of the case main body 41.

Further, the upper cover 42 is attached to the case main body 41 in a manner that a lower end in the vertical direction Y1 of the peripheral wall 42B is overlapped with an outside of an upper end in the vertical direction Y1 of the peripheral wall 41A of the case main body 41. Namely, the peripheral wall 42B of the upper cover 42 is positioned outside of the peripheral wall 41A of the case main body 41. Thereby, because a gap between the peripheral wall 42B of the upper cover 42 and the peripheral wall 41A of the case main body 41 is opened downward in the vertical direction Y1, the water falling down from the case 4 is prevented from entering an inside of the case via the gap between the peripheral wall 42B of the upper cover 42 and the peripheral wall 41A of the case main body 41.

Further, a plurality of locking portions 7 for fixing the case main body 41 and the upper cover 42 to each other is provided on the peripheral wall 41A of the case main body 41 and the peripheral wall 42B of the upper cover 42. This locking portion 7 is composed of a lock receiving portion 71 projected upward in the vertical direction Y1 from the peripheral wall 41A of the case main body 41, and a locking arm 72 projected downward in the vertical direction Y1 from the peripheral wall 42B of the upper cover 42 for locking with the lock receiving portion 71.

The lower cover 43 is formed in a box shape, and opened upward in the vertical direction Y1 by a bottom wall 43A covering an opening composed of a lower edge in the vertical direction Y1 of the peripheral wall 41A of the case main body 41, and by a peripheral wall 43B extended upward in the vertical direction Y1 from an outer edge of the bottom wall 43A. The lower cover 43 is attached to a bottom of the case main body 41 for covering the opening composed of the lower edge in the vertical direction Y1 of the peripheral wall 41A of the case main body 41.

Further, as shown in FIG. 2, the lower cover 43 is attached to the case main body 41 in a manner that an upper end in the vertical direction Y1 of the peripheral wall 43B is overlapped with an inside of a lower end in the vertical direction Y1 of the peripheral wall 41A of the case main body 41. Namely, the peripheral wall 43B of the lower cover 43 is positioned inside of the peripheral wall 41A of the case main body 41. Thereby, because a gap between the peripheral wall 43B of the lower cover 43 and the peripheral wall 41A of the case main body 41 is opened downward in the vertical direction Y1, the water falling down from the case 4 is prevented from entering an inside of the case via the gap between the peripheral wall 43B of the lower cover 43 and the peripheral wall 41A of the case main body 41.

Further, as shown in FIGS. 1 and 2, a plurality of locking portions 8 for fixing the case main body 41 and the lower cover 43 to each other is provided on the peripheral wall 41A of the case main body 41 and the peripheral wall 43B of the lower cover 43. This locking portion 8 is composed of a lock receiving portion 81 projected outward from the peripheral wall 41A of the case main body 41, and a locking arm 82 projected upward in the vertical direction Y1 from the peripheral wall 43B of the lower cover 43 for locking with the lock receiving portion 81 upon inserting into a locking hole formed between the peripheral wall 41A of the case main body 41 and the lock receiving portion 81.

As shown in FIG. 2, the guide portion 5 is formed in a tubular shape, and communicates with a guide hole 9 provided on the peripheral wall 41A of the case main body 41. One end of the harness 6 is passed through the guide portion 5 and guided out from the case 4, while the other end of the harness 6 is connected to the electric parts 2. Further, the guide portion 5 is composed of a pair of gutter-shaped portions 51, 52. Each of the pair of gutter-shaped portions 51, 52 is formed in a gutter shape and includes: a bottom wall 53, 54, and a pair of vertical wall 55, 56 extended from both ends in a circumferential direction Y2 of the bottom wall 53, 54.

The gutter-shaped portion 51 is integrally provided on the peripheral wall 41A of the case main body 41. In detail, the guide hole 9 for guiding out the harness 6 is provided on a lower edge in the vertical direction Y1 of the case main body 41, and the whole bottom wall 53 of the gutter-shaped portion 51 is integrally provided on the peripheral wall 41A above the guide hole 9 in the vertical direction Y1. Further, the vertical wall 55 of the gutter-shaped portion 51 is extended toward an outside of the case 4 from the bottom wall 53.

In contrast, the gutter-shaped portion 52 integrally provided on the peripheral wall 43B of the lower cover 43. In detail, the bottom wall 54 of the gutter-shaped portion 52 is extended upward in the vertical direction Y1 from the peripheral wall 43B of the lower cover 43. Namely, a lower end in the vertical direction Y1 of the bottom wall 54 of the gutter-shaped portion 52 is connected to an upper end in the vertical direction Y1 of the peripheral wall 43B of the lower cover 43 via a later-described hinge 57 (flexible portion), and the vertical wall 56 is extended toward an inside of the case from the bottom wall 54.

Figure 3:
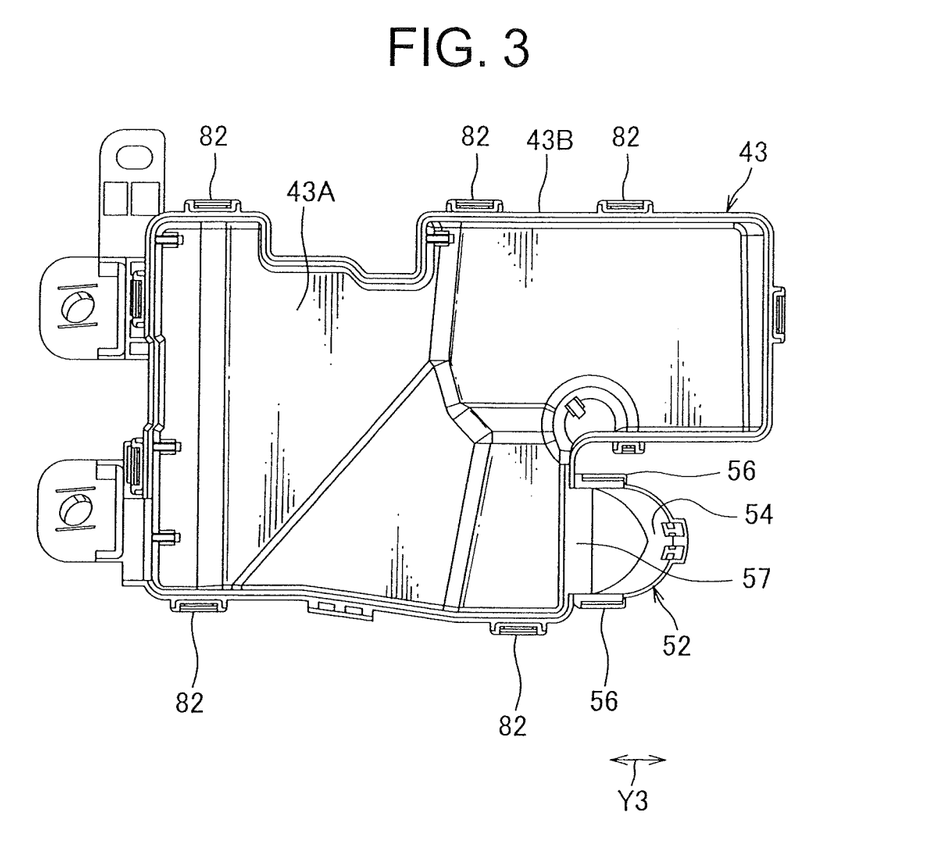
FIG. 3 is a top view showing a lower cover as a component of the electric junction box shown in FIG. 1.
Figure 4A:
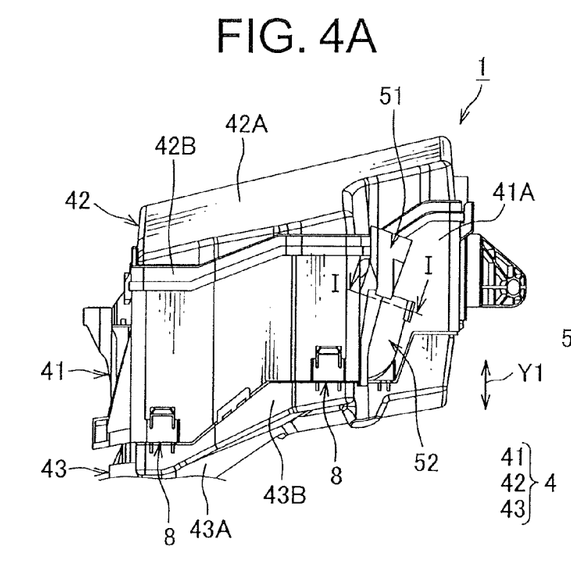
FIG. 4A is a side view showing the electric junction box shown in FIG. 1 when a harness having the minimum diameter Rmin is passed through a guide portion.
Figure 4B:
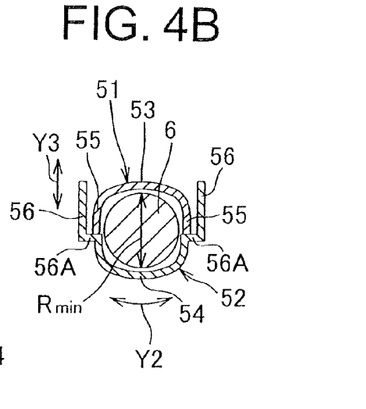
FIG. 4B is a sectional schematic view taken on line I-I of FIG. 4A.
Figure 5A:
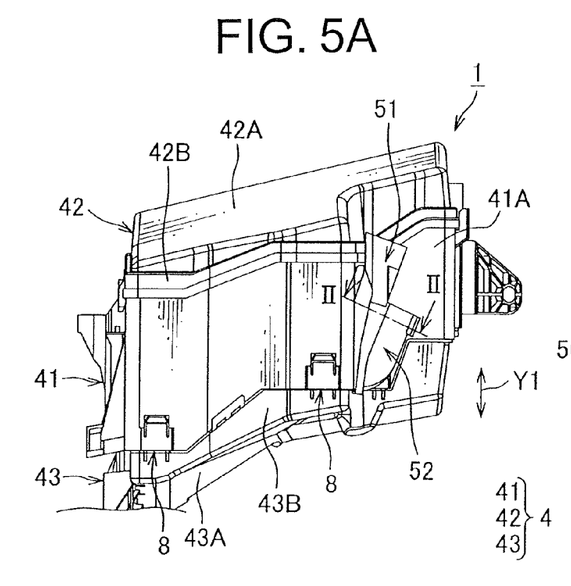
FIG. 5A is a side view showing the electric junction box shown in FIG. 1 when a harness having the maximum diameter Rmax is passed through a guide portion.
Figure 5B:
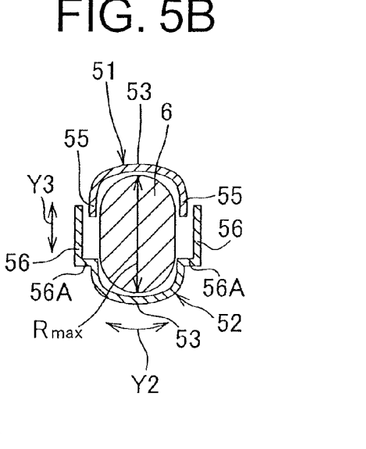
FIG. 5B is a sectional schematic view taken on line II-II of FIG. 5A.
Figure 6:
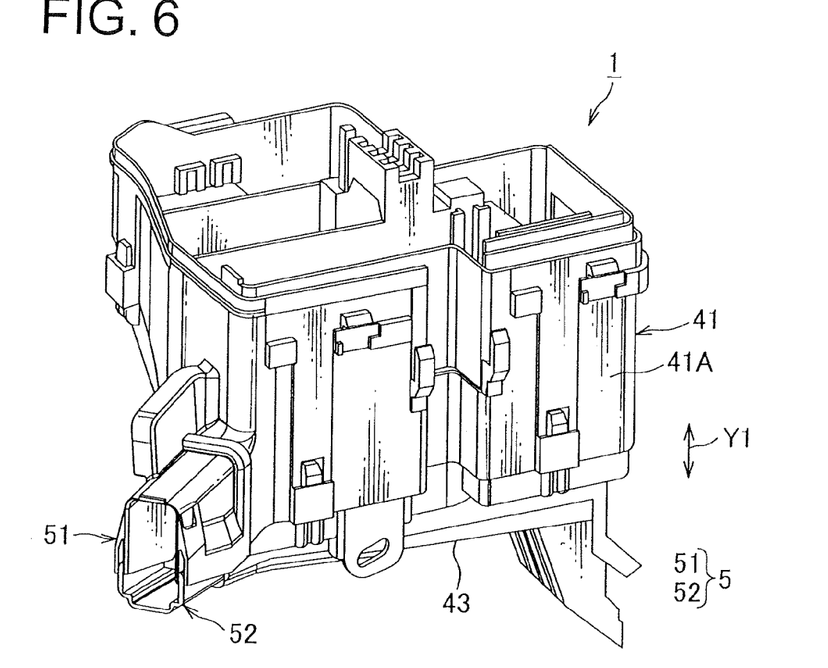
FIG. 6 is a perspective view showing the electric junction box according to a second embodiment of the present invention.
Figure 7:
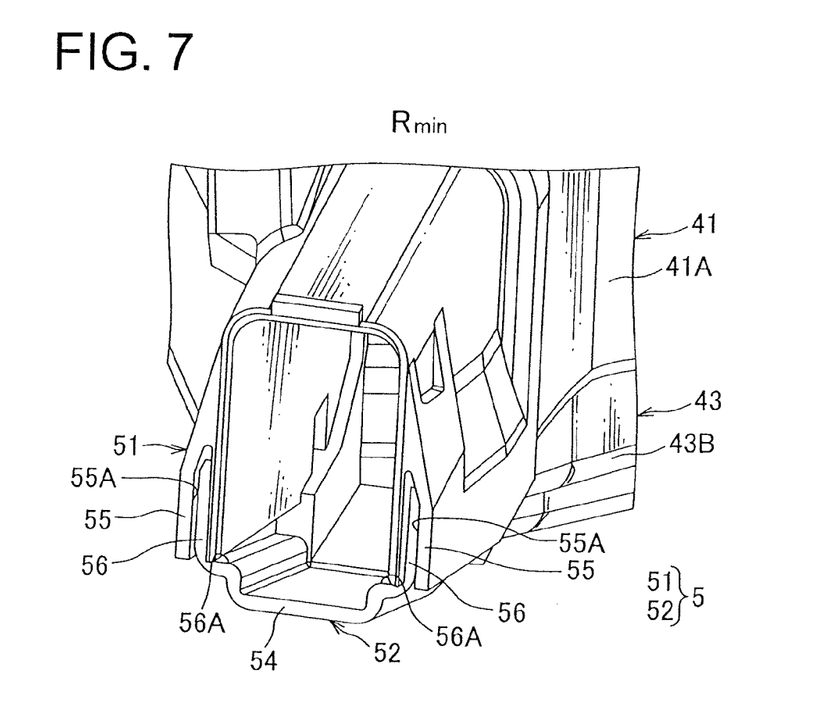
Figure 8:
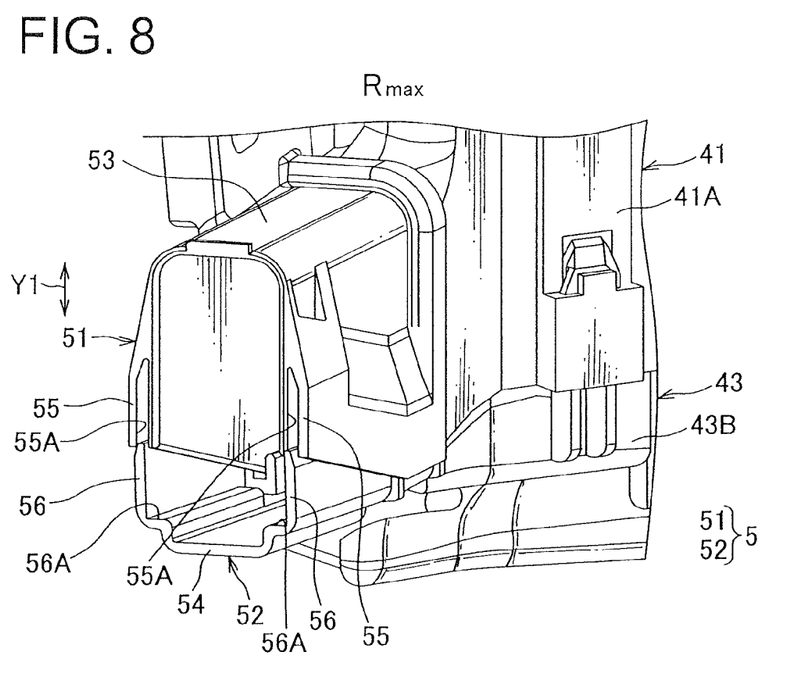
Figure 9:
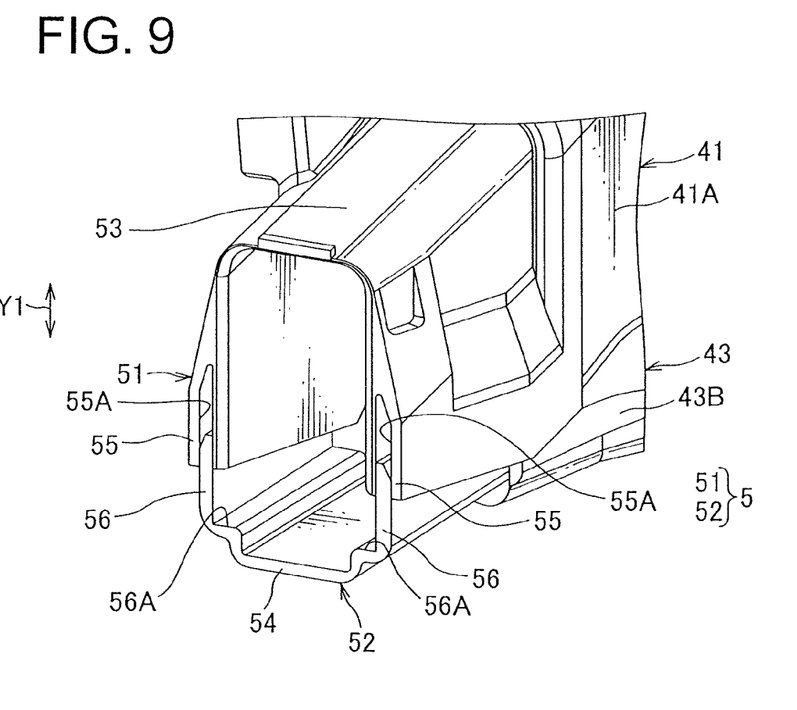

When the lower cover 43 is attached to the case main body 41, the guide hole 9 is covered by the bottom wall 54 of the gutter-shaped portion 52. Further, the bottom walls 53, 54 of the pair of gutter-shaped portions 51, 52 face to each other, and the vertical walls 55, 56 are overlapped with each other in a radial direction (In detail, as shown in FIGS. 4B and 5B, an outer side wall of the vertical wall 55 is overlapped with an inner side wall of the vertical wall 56.), thereby the guide portion 5 becomes in a tubular shape. Further, as shown in FIG. 3, the elastically deformable hinge 57 configured to allow the gutter-shaped portion 52 to be moved close to or away from the gutter-shaped portion 51 in a direction Y3 (a direction that the gutter-shaped portion 52 is moved close to or away from the gutter-shaped portion 51) is provided between the bottom wall 54 of the gutter-shaped portion 52 and the lower cover 43.

The hinge 57 is formed thinner than the bottom wall 54 and formed elastically deformable so that the gutter-shaped portion 52 can be moved both close to the gutter-shaped portion 51 to reduce a diameter of the guide portion 5 and away from the gutter-shaped portion 51 to increase the diameter of the guide portion 5.

Further, as shown in FIG. 4B, the vertical wall 56 of the gutter-shaped portion 52 is provided with an abutting portion 56A abutting on an end wall of the vertical wall 55 of the gutter-shaped portion 51 when the hinge 57 is in a neutral position (namely, in a condition that the hinge 57 is not elastically deformed). Therefore, when the gutter-shaped portion 52 is moved closer to the gutter-shaped portion 51 than the neutral position of the hinge 57, because the abutting portion 56A abuts on the vertical wall 55 of the gutter-shaped portion 52, an inner diameter of the guide portion 5 is prevented from being smaller than the inner diameter when the hinge 57 is in the neutral position.

Next, a size of the guide portion 5 will be explained. As explained in the conventional example, it is necessary to guide out a harness 6 having different thickness corresponding to the electronic devices mounted on a vehicle which is varied according to the grades or the specifications. Now, assume that a range of the diameter of the harness 6 guided out of the electric junction box 1 is designed to be from the minimum diameter Rmin to the maximum diameter Rmax. As shown in FIG. 4B, the inner diameter of the guide portion 5 when the hinge 57 is in the neutral position is equal to the minimum diameter Rmin of the harness 6.

Namely, an inner diameter of the guide portion 5 is so formed that when the harness 6 having the minimum diameter Rmin is passed, the hinge 57 becomes in the neutral position, and no gap is generated between the guide portion 5 and the harness 6. At this time, of course, the vertical walls 55, 56 are overlapped with each other.

When the harness 6 having the diameter larger than the minimum diameter Rmin is guided out, the hinge 57 is bent and the gutter-shaped portion 52 is bent in a direction away from the gutter-shaped portion 51. Namely, the inner diameter of the guide portion 5 is increased. When the gutter-shaped portion 52 is bent in a direction away from the gutter-shaped portion 51 in this way, a restoring force for returning to the neutral position is generated in the gutter-shaped portion 52, thereby a force for moving close to each other is generated between the gutter-shaped portions 51, 52. Therefore, the gutter-shaped portion 52 and the harness 6 are closely attached to each other without any gap.

Further, as shown in FIG. 5B, when the harness 6 having the maximum diameter Rmax is guided out, the hinge 57 is also bent and the gutter-shaped portion 52 is bent in a direction away from the gutter-shaped portion 51. Namely, the inner diameter of the guide portion 5 is increased. Similarly, when the gutter-shaped portion 52 is bent in a direction away from the gutter-shaped portion 51 in this way, a restoring force for returning to the neutral position is generated in the gutter-shaped portion 52, thereby a force for moving close to each other is generated between the gutter-shaped portions 51, 52. Therefore, the gutter-shaped portion 52 and the harness 6 are closely attached to each other without any gap. Further, when the harness 6 having the maximum diameter Rmax is guided out, the pair of gutter-shaped portions 51, 52 become separated farthest away from each other. In this condition, as shown in FIG. 5B, the gutter-shaped portions 51, 52 are so provided that the vertical walls 55, 56 are overlapped with each other.

Next, an assembling procedure of the electric junction box 1 will be explained. First, a case when the harness 6 having the minimum diameter Rmin is used will be explained. The electric parts 2 to which an end of the harness 6 is connected are mounted on the cassette block 3, and the cassette block 3 on which the electric parts 2 are mounted is received in the case main body 41. Alternatively, after the cassette block 3 on which the electric parts 2 are mounted is received in the case main body 41, an end of the harness 6 may be connected to the electric parts 2. Then, the other end of the harness 6 is guided out of the case main body 41 via the guide hole 9 provided on the case main body 41. Next, while the other end of the harness 6 is guided out of the case main body 41, the lower cover 43 is moved close to the case main body 41 for covering a bottom wall of the case main body 41.

Then, the vertical wall 55 of the gutter-shaped portion 51 is overlapped with an inside of the vertical wall 56 of the gutter-shaped portion 52, and the locking arm 82 of the lower cover 43 is locked with the lock receiving portion 81 of the case main body 41, thereby the tubular guide portion 5 is assembled. At this time, the harness 6 guided out of the case main body 41 via the guide hole 9 is passed through an inside of the guide portion 5. As described above, an inner diameter of the guide portion 5 when the hinge 57 is in the neutral position is equal to the minimum diameter Rmin of the harness 6 as shown in FIG. 4B. Therefore, when the harness 6 having the minimum diameter Rmin is passed through the guide portion 5, the hinge 57 is in the neutral position, and though a force to move the gutter-shaped portions 51, 52 close to each other is not generated, the gutter-shaped portion 52 and the harness 6 are closely attached to each other without any gap.

Next, a case when the harness 6 having the outer diameter larger than the minimum diameter Rmin is used will be explained. Incidentally, a duplicative explanation with the case when the harness 6 having the minimum diameter Rmin is used will be omitted. While the other end of the harness 6 is guided out from the case main body 41 via the guide hole 9, the lower cover 43 is moved close to the case main body 41 for covering a bottom wall of the case main body 41. Then, as shown in FIG. 4B, the bottom wall 53 of the gutter-shaped portion 52 abuts on an outer peripheral wall of the harness 6. When the lower cover 43 is moved further close to the case main body 41, the gutter-shaped portion 52 is pressed by the harness 6 in a direction away from the gutter-shaped portion 51, namely, a direction to increase the diameter of the guide portion 5, and the hinge 57 is elastically deformed in a direction that the gutter-shaped portions 51, 52 are separated away from each other.

Namely, while the 57 is bent so that the pair of gutter-shaped portions 51, 52 is positioned further away from each other than the neutral position of the hinge 57, the harness 6 is passed through the guide portion 5. Thereby, because a restoring force to return to the neutral position is generated on the hinge 57, a force to move the gutter-shaped portions 51, 52 close to each other is generated. Therefore, the gutter-shaped portion 52 and the harness 6 are closely attached to each other without any gap. When the lower cover 43 is moved further close to the case main body 41, the locking arm 82 of the lower cover 43 is locked with the lock receiving portion 81 of the case main body 41, thereby the guide portion 5 is assembled.

According to the electric junction box 1 described above, the elastically deformable hinge 57 configured to allow the gutter-shaped portion 52 to be moved close to or away from the gutter-shaped portion 51 in the direction Y3 is provided between the gutter-shaped portion 52 and the lower cover 43. Further, the vertical walls 55, 56 of the pair of gutter-shaped portions 51, 52 are overlapped with each other in the radial direction.

Therefore, when a thick harness 6 is passed through the guide portion 5, the hinge 57 is elastically deformed in a manner that the gutter-shaped portion 52 is moved away from the gutter-shaped portion 51 to increase the diameter of the guide portion 5. When a thin harness 6 is passed through the guide portion 5, the hinge 57 is elastically deformed in a manner that the gutter-shaped portion 52 is moved close to the gutter-shaped portion 51 to reduce the diameter of the guide portion 5. Namely, by providing the hinge 57, the inner diameter of the guide portion 5 is configured to be adjustable at low cost, and by matching the diameter of the harness 6, the gap between the harness 6 and the guide portion 5 is eliminated. Further, when the inner diameter of the guide portion 5 is adjusted as far as the vertical walls 55, 56 of the gutter-shaped portions 51, 52 are overlapped with each other, a gap is not generated in the guide portion 5. Therefore, the electric junction box 1 able to prevent water from entering an inside of the electric junction box 1 via the guide portion 5 of the harness 6 even when the harness 6 having a different thickness is used can be provided at low cost.

Further, according to the electric junction box 1 described above, the pair of gutter-shaped portions 51, 52 is so provided that the vertical walls 55, 56 of the pair of gutter-shaped portions 51, 52 are overlapped with each other from a position where the harness 6 having the minimum diameter Rmin is passed through the guide portion 5 and the pair of gutter-shaped portions 51, 52 are moved closest to each other (FIG. 4B) to a position where the harness 6 having the maximum diameter Rmax is passed through the guide portion 5 and the pair of gutter-shaped portions 51, 52 are moved farthest away from each other (FIG. 5B). Therefore, when the harness 6 having from the minimum diameter Rmin to the maximum diameter Rmax is used, water is prevented from entering an inside of the electric junction box 1 via the guide portion 5 of the harness 6.

According to the electric junction box 1 described above, when the diameter of the harness 6 is larger than the minimum diameter Rmin, while the hinge 57 is bent so that the gutter-shaped portion 52 is moved farther away from the gutter-shaped portion 51 than the neutral position of the hinge 57, the harness 6 is passed through the guide portion 5. Therefore, a restoring force to move the pair of gutter-shaped portions 51, 52 close to each other for returning to the neutral position is generated. Therefore, the gutter-shaped portions 51, 52 and the harness 6 are closely attached to each other without any gap, and water is surely prevented from entering an inside of the electric junction box 1 via the guide portion 5 of the harness 6.

According to the electric junction box 1 described above, an inner diameter of the guide portion 5 in the neutral position of the hinge 57 where the hinge 57 is not elastically deformed is equal to the minimum diameter Rmin of the harness 6. When an outer diameter of the harness 6 is increased, the hinge 57 is bent so that the gutter-shaped portions 51, 52 are moved away from each other. Therefore, when the harness 6 having the minimum diameter Rmin is passed through the guide portion 5, the hinge 57 is in the neutral position where the hinge 57 is not elastically deformed, and the guide portion 5 is designed so that there is no gap between the guide portion 5 and the harness 6 having the minimum diameter Rmin at this time. Further, when an outer diameter of the harness 6 is increased, the hinge 57 is bent so that the gutter-shaped portions 51, 52 are moved away from each other. Namely, a restoring force to move the pair of gutter-shaped portions 51, 52 close to each other for returning to the neutral position is generated. Therefore, the gutter-shaped portions 51, 52 and the harness 6 are closely attached to each other without any gap, and water is surely prevented from entering an inside of the electric junction box 1 via the guide portion 5 of the harness 6.

Second Embodiment

Next, the electric junction box 1 according to a second embodiment of the present invention will be explained with reference to FIGS. 6 to 9. Incidentally, in these figures, the same parts as the first embodiment in FIGS. 1 to 5 are denoted the same reference numerals and detailed explanations thereof are omitted. A difference between the first and second embodiments is a shape of the guide portion 5. As shown in FIGS. 6 to 9, the guide portion 5 is formed in a tubular shape as same as the first embodiment, and communicates with a not shown guide hole provided on the case main body 41 and the lower cover 43. Further, the guide portion 5 is composed of the pair of gutter-shaped portions 51, 52. Each of the pair of gutter-shaped portions 51, 52 is composed of the bottom wall 53, 54 and a pair of vertical walls 55, 56 extended from both ends in a circumferential direction Y2 of the bottom wall 53, 54, and formed in a gutter shape.

The gutter-shaped portion 51 is integrally formed with the peripheral wall 41A of the case main body 41. In detail, a not-shown guide hole for guiding out the harness 6 is provided on a lower end in the vertical direction Y1 of the case main body 41. The bottom wall 53 and the vertical wall 55 are extended toward an outside of the case 4 from an edge of the guide hole. Further, the vertical wall 55 of the gutter-shaped portion 51 is extended downward in the vertical direction Y1 from the bottom wall 53. This vertical wall 55 of the gutter-shaped portion 51 is extended further downward in the vertical direction Y1 than a lower end in the vertical direction Y1 of the peripheral wall 41A of the case main body 41. Further, a groove 55A concaved upward in the vertical direction Y1 is provided on the vertical wall 55.

In contrast, the gutter-shaped portion 52 is integrally formed with a peripheral wall 43B of the lower cover 43. In detail, a not-shown guide hole for guiding out the harness 6 is provided on an upper end in the vertical direction Y1 of the lower cover 43. The bottom wall 54 is projected from a lower edge in the vertical direction Y1 of the guide hole. A not-shown hinge is provided between the bottom wall 54 and the lower cover 43. Further, the vertical wall 54 of the gutter-shaped portion 52 is extended upward in the vertical direction Y1 from the bottom wall 54. A height of this vertical wall 56 is gradually lowered as the vertical wall 56 is extended toward the peripheral wall 43B of the lower cover 43. Thereby, when the not-shown hinge is bent, the gutter-shaped portion 52 is moved away from or close to the gutter-shaped portion 51. Further, the vertical wall 56 of the gutter-shaped portion 52 is inserted into the groove 55A, and overlapped with the vertical wall 55.

According to the electric junction box 1 of the second embodiment, because the vertical wall 56 of the gutter-shaped portion 52 is inserted into the groove 55A provided on the vertical wall 55, water is further surely prevented from entering an inside of the electric junction box 1 via the guide portion 5 of the harness 6.

Incidentally, in the first and second embodiments, the hinge 57 is only provided on one of the pair of gutter-shaped portions 51, 52 (in the first and second embodiment, the hinge 57 is provided on the gutter-shaped portion 52), however, the present invention is not limited to this. For example, the hinges 57 may be provided on both of the pair of gutter-shaped portions 51, 52.

Further, according to the first and second embodiments, the inner diameter of the guide portion 5 in the neutral position where the hinge 57 is not elastically deformed is fitted for the minimum diameter Rmin of the harness 6. However, the present invention is not limited to this. For example, when the harness 6 having the minimum diameter Rmin is inserted into the guide portion 5, the gutter-shaped portion 52 may be moved close to the gutter-shaped portion 51, thereby the gap between the guide portion 5 and the harness 6 is eliminated.

Although the present invention has been fully described by way of example with reference to the accompanying drawings, it is to be understood that various changes and modifications will be apparent to those skilled in the art. Therefore, unless otherwise such changes and modifications depart from the scope of the present invention hereinafter defined, they should be construed as being included therein.

What is claimed is:

1. An electric junction box comprising:
   a box main body;
   a tubular guide portion projecting from the box main body and guiding a harness out of the box main body,
   said guide portion being divided to a pair of gutter-shaped portions, each gutter-shaped portion being composed of a bottom wall portion and a pair of flat vertical wall portions extended vertically from both sides of the bottom wall portion in a circumferential direction, and the respective flat vertical wall portions of the pair of gutter-shaped portions being overlapped with each other in a radial direction; and
   an elastically deformable flexible portion provided between at least one of the pair of gutter-shaped portions and the box main body, the elastically deformable flexible portion allowing the one gutter-shaped portion to be moved away from or close to the other gutter-shaped portion,
   wherein an inner diameter of the guide portion in a neutral state, in which the flexible portion is not elastically deformed, is fitted for a smallest outer diameter of the harness and when the outer diameter of the harness is increased, the flexible portion is bent so as to move the pair of gutter-shaped portions away from each other.

2. The electric junction box as claimed in claim 1, wherein the pair of gutter-shaped portions is so formed that the respective vertical wall portions of the pair of gutter-shaped portions are kept overlapped with each other from a position where the pair of gutter-shaped portions is moved closest to each other when the harness having the smallest outer diameter is passed through the guide portion to a position where the pair of gutter-shaped portions is moved farthest away from each other when the harness having the largest outer diameter is passed through the guide portion.

3. The electric junction box as claimed in claim 2, wherein a groove is provided on each vertical wall portion of the one gutter-shaped portion, and each vertical portion of the other gutter-shaped portion is inserted into the groove.

4. The electric junction box as claimed in claim 3, wherein the harness is passed through the guide portion while the flexible portion is bent from a neutral position of the flexible portion so as to position the pair of gutter-shaped portions away from each other.

5. The electric junction box as claimed in claim 3, wherein an inner diameter of the guide portion in the neutral state in which the flexible portion is not elastically deformed is fitted for the smallest outer diameter of the harness, and when the outer diameter of the harness is increased, the flexible portion is bent so as to move the pair of gutter-shaped portions away from each other.

6. The electric junction box as claimed in claim 2, wherein the harness is passed through the guide portion while the flexible portion is bent from a neutral position of the flexible portion so as to position the pair of gutter-shaped portions away from each other.

7. The electric junction box as claimed in claim 2, wherein an inner diameter of the guide portion in the neutral state in which the flexible portion is not elastically deformed is fitted for the smallest outer diameter of the harness, and when the outer diameter of the harness is increased, the flexible portion is bent so as to move the pair of gutter-shaped portions away from each other.

8. The electric junction box as claimed in claim 1, wherein a groove is provided on each vertical wall portion of the one gutter-shaped portion, and each vertical portion of the other gutter-shaped portion is inserted into the groove.

9. The electric junction box as claimed in claim 8, wherein the harness is passed through the guide portion while the flexible portion is bent from a neutral position of the flexible portion so as to position the pair of gutter-shaped portions away from each other.

10. The electric junction box as claimed in claim 8, wherein an inner diameter of the guide portion in the neutral state in which the flexible portion is not elastically deformed is fitted for the smallest outer diameter of the harness, and when the outer diameter of the harness is increased, the flexible portion is bent so as to move the pair of gutter-shaped portions away from each other.

11. The electric junction box as claimed in claim 1, wherein the harness is passed through the guide portion while the flexible portion is bent from a neutral position of the flexible portion so as to position the pair of gutter-shaped portions away from each other.

12. The electric junction box as claimed in claim 1, wherein the elastically deformable flexible portion is attached to the box main body.

13. The electric junction box as claimed in claim 12, wherein the tubular guide portion is attached to the box main body via the elastically deformable flexible portion.

14. The electric junction box as claimed in claim 1, wherein the tubular guide portion is attached to the box main body.

15. The electric junction box as claimed in claim 1, wherein the movement of the one gutter-shaped portion is caused by an outer peripheral wall of the harness abutting an interior of the one gutter-shaped portion.

\* \* \* \* \*